United States Patent [19]

Tumminelli

[11] Patent Number: 5,141,549
[45] Date of Patent: Aug. 25, 1992

[54] METHOD OF FABRICATING RARE EARTH DOPED PLANAR OPTICAL WAVEGUIDE FOR INTEGRATED OPTICAL CIRCUIT

[75] Inventor: Richard P. Tumminelli, Ashland, Mass.

[73] Assignee: The Charles Stark Draper Laboratories, Cambridge, Mass.

[21] Appl. No.: 703,150

[22] Filed: May 17, 1991

[51] Int. Cl.⁵ .................................. C03B 5/18
[52] U.S. Cl. ......................... 65/18.2; 65/18.3; 65/31
[58] Field of Search ............. 65/18.2, 18.3, 18.4, 65/31, 60.2, 60.52; 156/663; 385/129, 130, 131, 132

[56] References Cited

U.S. PATENT DOCUMENTS

| | | | |
|---|---|---|---|
| 3,737,292 | 6/1973 | Keck et al. | 65/3.12 |
| 3,873,339 | 3/1975 | Hudson | 65/18.2 |
| 4,501,602 | 2/1985 | Miller et al. | 65/901 |
| 4,718,929 | 1/1988 | Power et al. | 65/DIG. 16 |
| 4,826,288 | 5/1989 | Mansfield et al. | 65/3.12 |

*Primary Examiner*—W. Gary Jones
*Assistant Examiner*—John J. Bruckner
*Attorney, Agent, or Firm*—Iandiorio & Dingman

[57] ABSTRACT

A method of fabricating rare earth doped planar optical waveguides for integrated optical circuits includes introducing a first carrier gas to a heated column of rare earth chelate to create a flow of rare earth chelate vapor in the carrier; introducing a second carrier gas through a silicon precursor to create a flow of silicon precursor vapor in the carrier; submitting the flow of rare earth chelate vapor and the flow of silicon precursor vapor with oxygen and a homogenizing agent to a flame hydrolysis deposition burner to produce a soot of rare earth doped silica; and depositing the soot on a planar substrate; and etching the soot, after consolidation, to define one or more discrete channel waveguides.

28 Claims, 3 Drawing Sheets

METHOD OF FABRICATING RARE EARTH DOPED PLANAR OPTICAL WAVEGUIDE FOR INTEGRATED OPTICAL CIRCUIT

FIELD OF INVENTION

This invention relates to an improved method of fabricating rare earth doped planar optical waveguides for integrated optical circuits, and more particularly to utilizing flame hydrolysis deposition and vapor phase transport of volatile rare earth chelate compounds to obtain uniform rare earth distribution.

BACKGROUND OF INVENTION

Rare earth doped optical waveguides are attracting more and more interest for use as lasers and amplifiers. The extension of rare earth doping to integrated optics has recently received considerable attention due to the potential for mutiple-device fabrication on a single substrate.

In one approach, glass waveguides are made by ion exchange techniques made directly in the substrate. For example, an ion exchange with a rare earth doped substrate results in a laser or amplifier. However, this approach demands careful selection and control of the substrate glass composition and processing techniques to obtain desirable low loss waveguides. In addition, since the rare earth doping is not limited to selected sites or channels but exists throughout the substrate, low loss passive elements cannot be fabricated along with the active laser or amplifier elements in three-level rare earth systems due to the attenuation in the unpumped regions. Erbium is a three-level system and is a preferred dopant because it exhibits optical gain in the 1.5 micron region. For reasons stated previously, ion exchange is not a good method for fabricating devices based on erbium doped waveguides.

In another approach, flame hydrolysis deposition (FHD) and a solution doping technique used in creating rare earth doped optical fibers, is applied to make rare earth doped planar waveguides. FHD is used to deposit a layer of unconsolidated silica ($SiO_2$) soot on a planar substrate. The wafer is then emersed in a solution containing rare earth ions, removed and dried. The soot is then consolidated to include the rare earth oxide and create on the substrate a rare earth doped glass which can be formed into active optical components such as lasers and amplifiers. One problem with this approach is that the distribution of the rare earth in the consolidated soot is not very uniform. This is so because the uniformity depends on the diffusion of the rare earth during consolidation when in fact rare earth elements are not very mobile. Non-uniformity is problematic because it causes clustering and it lends itself to concentration quenching from high local concentration of rare earth.

SUMMARY OF INVENTION

It is therefore an object of this invention to provide a method of fabricating rare earth doped planar optical waveguides for integrated optical circuits which produces a more uniform distribution of the rare earth.

It is a further object of this invention to provide such a method which achieves higher purity and permits closer control of concentration and distribution of the rare earth.

It is a further object of this invention to provide such a method which results in a very low loss planar waveguide.

It is a further object of this invention to provide such a method which readily facilitates multiple rare earth doping.

It is a further object of this invention to provide such a method in which the rare earth dopes the glass layer instead of the substrate so that discrete channels and elements can be achieved by conventional etching techniques.

It is a further object of this invention to provide such a method which easily allows doping with aluminum, phosphorous or other homogenizing agents.

It is a further object of this invention to provide such a method which eliminates a separate doping step (solution doping).

It is a further object of this invention to provide such a method which is faster, less expensive, more reliable and predictable and with higher quality results.

It is a further object of this invention to provide such a method which employs a simple vapor phase transport system to uniformly combine the constituents at the flame hydrolysis deposition burner.

The invention results from the realization that an improved low loss planar optical waveguide can be made by using vapor phase transport techniques to supply both the silicon precursor and the rare earth chelate to a flame hydrolysis deposition burner to create a silica soot uniformly mixed with the rare earth oxide and deposit it on a planar substrate, for subsequent consolidation and etching to form a number of discrete channel waveguides.

The method of fabricating rare earth doped planar optical waveguides for integrated optical circuits. A first carrier gas is introduced through a heated column of rare earth chelate to create a flow of rare earth chelate vapor in the carrier. A second carrier gas is introduced through a silicon precursor to create a flow of silicon precursor vapor in the carrier. The flow of rare earth chelate vapor and the flow of silicon precursor vapor is submitted with oxygen to a flame hydrolysis deposition burner to produce a soot of rare earth doped silica. The rare earth doped silica is deposited on a planar substrate.

In a preferred embodiment, the first carrier gas may be an inert gas such as helium or argon. The rare earth may be neodymium and the column temperature approximately 205° C., or the rare earth may be erbium and the column temperature approximately 175° C. The rare earth may also be ytterbium, terbium, thulium, holmium, praseodymium or samarium. The rare earth chelate may be the neodymium chelate of 2,2,6,6-tetramethyl-3,5-heptanedione (thd). In fact, the rare earth chelate may be any combination of the rare earths including neodymium, erbium, ytterbium, terbium, thulium, holmium, praseodymium and samarium, and the chelates:

2,2,6,6-tetramethyl-3,5-heptanedione (thd);
1,1,1 trifluoro-2,4-pentanedione (tfa)
1,1,1,5,5,5-hexofluoro-2,4-pentanedione (tfa)
1,1,1,5,5,5-hexofluoro-2,4-pentamedione (hfa)
6,6,7,7,8,8,8-heptafluoro-2,2-dimethyl-3,5-octandione (fod)
2,2,7-trimethyl-3,5-octanedione (tod)
1,1,1,5,5,6,6,7,7-decafluoro-2,4-heptanedione (dfhd)
1,1,1-trifluoro-6-methyl-2,4-heptanedione (tfmhd)

The second carrier gas may include an inert gas such as helium or argon, and the second carrier gas may also include oxygen. The second carrier gas and the silicon precursor may be heated to approximately 35° C., for example, or they may be cooled to approximately 20° C. The soot is typically silicon dioxide; the oxygen gas, instead of being delivered with the second carrier gas, may be delivered directly to the flame hydrolysis deposition burner to oxidize the silicon. The substrate may be silica or silicon.

The invention also features the planar optical waveguide made according to the above method.

The method may also include introducing a homogenizing agent to the flow of silicon precursor vapor and rare earth chelate vapor. The agent may be aluminum oxide or phosphorous oxide. The aluminum oxide may be introduced by passing a carrier gas through an aluminum precursor, and the phosphorous oxide may be similarly introduced by passing a carrier gas through a phosphorous precursor.

In subsequent steps the soot deposited on the substrate is consolidated, typically by heating and then etching may be done on the consolidated soot to define one or more discrete channel waveguides.

DISCLOSURE OF PREFERRED EMBODIMENT

Other objects, features and advantages will occur to those skilled in the art from the following description of a preferred embodiment and the accompanying drawings, in which:

Figure 1:
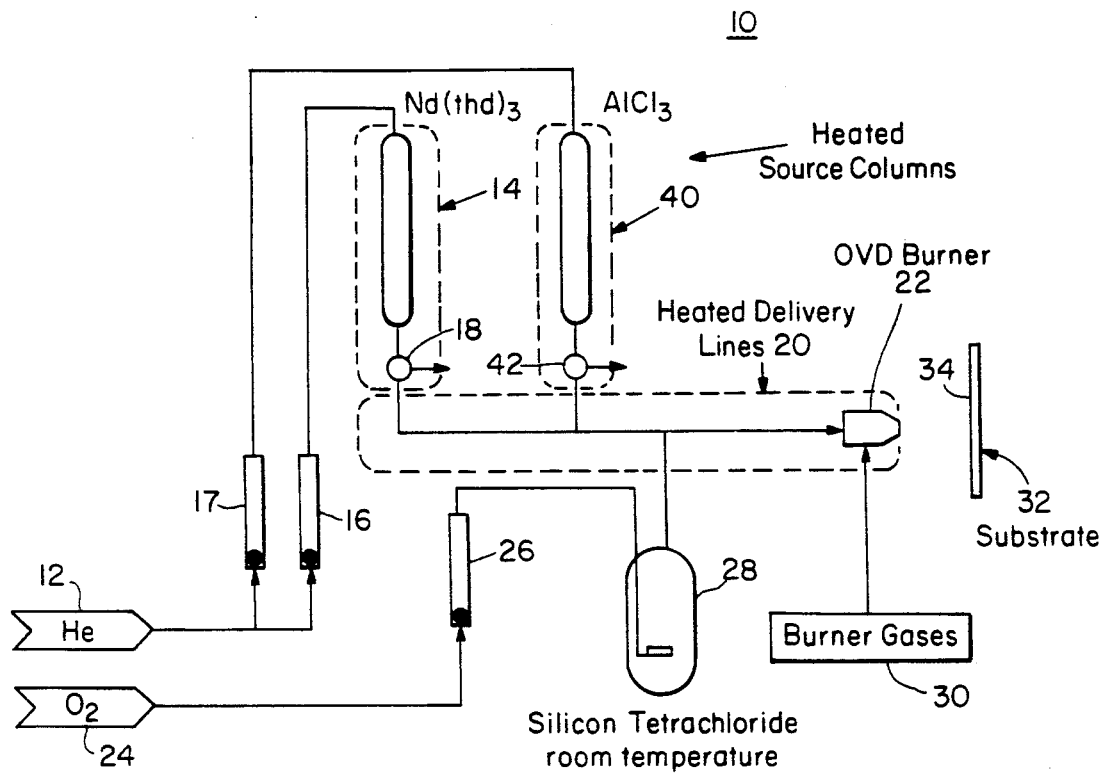
FIG. 1 is a schematic flow diagram of a system for fabricating rare earth doped optical waveguides according to this invention.

There is shown in FIG. 1 a system 10 for fabricating a rare earth doped planar optical waveguide. A first carrier gas such as helium 12 is delivered to a rare earth chelate column 14 that contains for example neodymium chelate, Nd(thd)$_3$. Chelates used to obtain sufficient vapor pressure for vapor phase transport deposition processes in optical fibers is disclosed in U.S. Pat. No. 4,826,288, of which the instant inventor is a co-inventor. That disclosure in its entirety is incorporated herein by reference. The helium flow to column 14 is controlled by mass flow controller 16. The neodymium chelate in vapor phase is transported through valve 18 to the heated delivery lines 20 that feed the flame hydrolysis deposition burner 22. A second carrier gas, which may also be an inert gas such as helium or argon or may be an active gas such as oxygen, is delivered through mass flow controller 26 to bubbler 28 which contains silicon tetrachloride at room temperature. The silicon tetrachloride in vapor phase is also delivered to the heated delivery lines 20. Burner 22 is fueled by burner gases 30 and is aimed to direct its emission to the surface 34 of substrate 32.

In operation, the silicon tetrachloride in vapor phase is oxidized at burner 22 with the oxygen from source 24 to form a silicon dioxide soot that is deposited on the facing surface 34 of substrate 32, along with the vapor phase neodymium chelate to provide a uniform distribution of the neodymium oxide throughout the unconsolidated silica soot. Subsequently, substrate 32 is heated to consolidate the soot along with the rare earth dopant and then is etched to provide one or more discrete optical elements on substrate 32.

In order to prevent clustering, a homogenizing agent such as aluminum is provided in column 40 fed via mass flow controller 17 by a carrier gas which can be the same inert gas used to feed column 14, namely helium from source 12. Column 40 holds an aluminum precursor such as aluminum chloride, AlCl$_3$. The vapor phase precursor, aluminum chloride, is delivered through valve 42 to heated delivery lines 20. At burner 22 the aluminum chloride is oxidized with the oxygen provided at 24 and is distributed along with the rare earth and silicon dioxide soot to provide a uniform distribution of the homogenizing agent across surface 34. The aluminum can also function as an agent to increase the index of refraction which is necessary for waveguiding.

Figure 2:
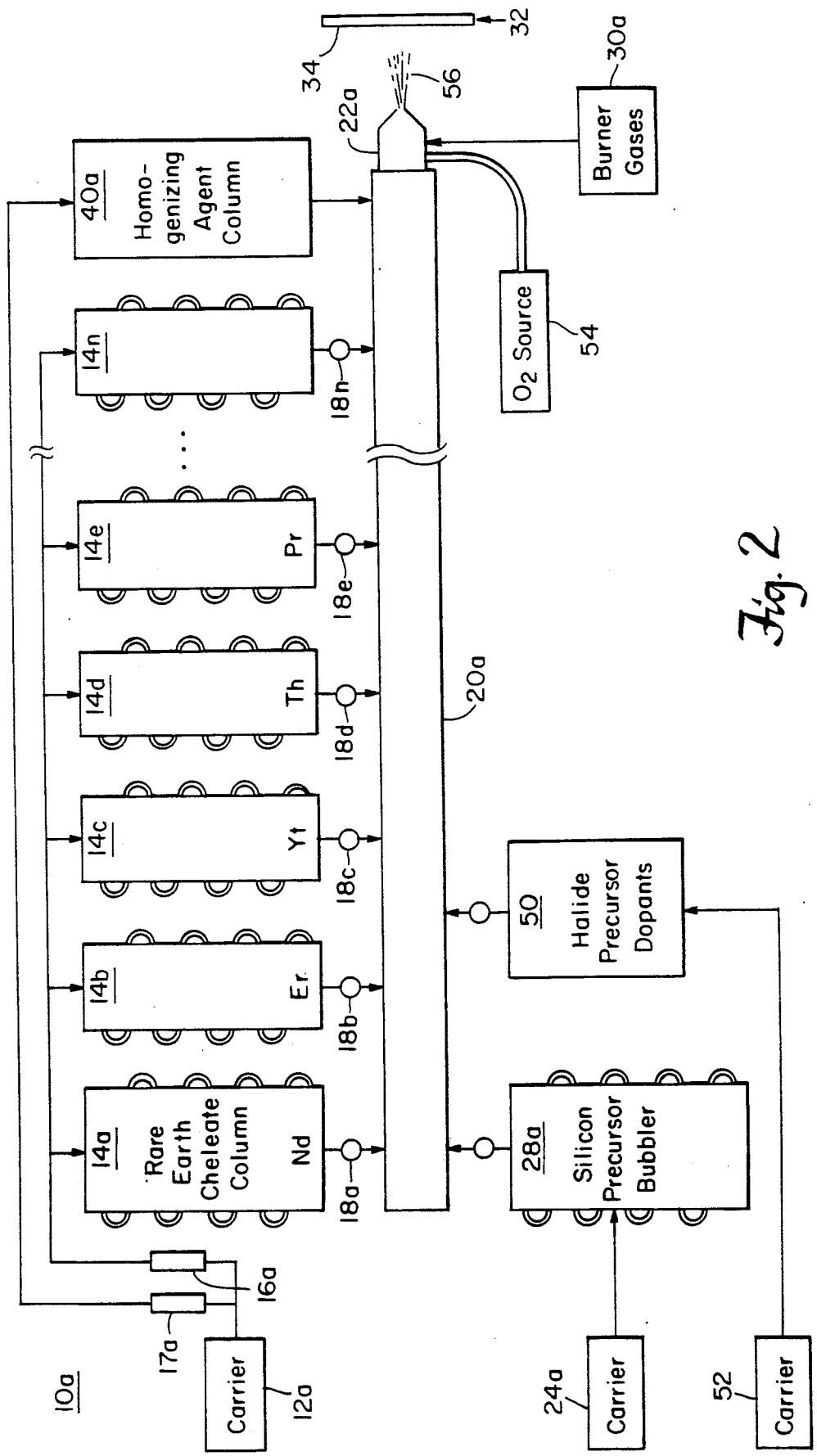
FIG. 2 is a more generalized schematic flow diagram of a system similar to that in FIG. 1 according to this invention.
Figure 4:
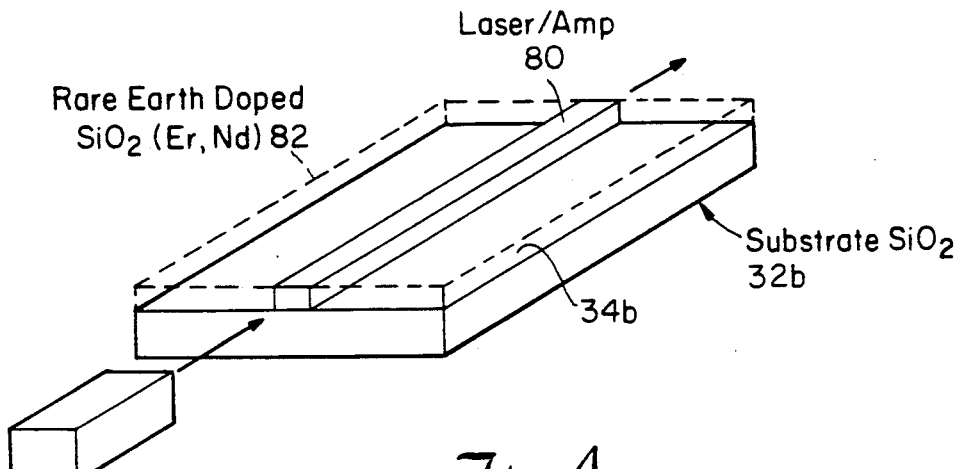
FIG. 4 is a three-dimensional view of an integrated optical laser or amplifier constructed by etching on a rare earth doped planar optical waveguide according to this invention.

In a more generalized implementation, FIG. 2, system 10a includes a number of rare earth chelate columns 14a-14n, each of which contains a different rare earth chelate, for example neodymium, erbium, ytterbium, terbium, thulium, holmium, praseodymium, and samarium. Silicon precursor bubbler 28a may contain silicon tetrachloride, silicon tetrabromide, tetraethyl orthosilicate, or other suitable silicon precursors. In addition, as shown in FIG. 2, an additional bubbler or bubblers 50 containing one or more halide precursor dopants may also be included. A carrier gas 52, typically an inert gas such as helium or argon, is used to create the vapor phase of the halide to be introduced into the heated delivery lines 20a. Such halide precursors may include one or more of germanium tetrachloride, phosphorous oxychloride, boron tribromide, or boron trichloride. In addition, fluorine sources such as silicon tetrafluoride, sulfur hexafluoride or freon compounds may be introduced to dope the glass with fluorine.

Although in FIG. 1 the second carrier in source 24 is oxygen, this is not a necessary limitation of the invention. The carrier may be another gas such as an inert gas like helium or argon, and the oxygen for oxidizing the silicon from bubbler 28 may be provided from an oxygen source 54 directly to nozzle 22a to accomplish the oxidation of the silicon resulting in the output stream 56 which impinges on surface 34 of substrate 32. Substrate 32 in turn may be silica or silicon. The temperature of rare earth chelate column 14a containing the rare earth neodymium is typically 205° C., whereas column 14b containing the rare earth erbium is set to about 175° C. The rare earth chelate columns may include any of a number of rare earths from the group including cesium, praseodymium, neodymium, samarium, europium, gadolinium, terbium, dysprosium, holmium, erbium, thulium, ytterbium in combination with the chelates made from the group of ligands including:

2,2,6,6-tetramethyl-3,5-heptanedione (thd);

1,1,1 trifluoro-2,4-pentanedione (tfa)
1,1,1,5,5,5-hexofluoro-2,4-pentamedione (hfa)
6,6,7,7,8,8,8-heptafluoro-2,2-dimethyl-3,5-octandione (fod)
2,2,7-trimethyl-3,5-octanedione (tod)
1,1,1,5,5,6,6,7,7,7-decafluoro-2,4-heptanedione (dfhd)
1,1,1-trifluoro-6-methyl-2,4-heptanedione (tfmhd)

The use of these ligands for making volatile rare earth chelate compounds is taught in U.S. Pat. No. 4,501,602, "Process for Making Sintered Glasses and Ceramics". The silicon precursor bubbler 28a may be either heated or cooled. A typical temperature level is approximately 35° C. for heating and 20° C. for cooling.

Figure 3:
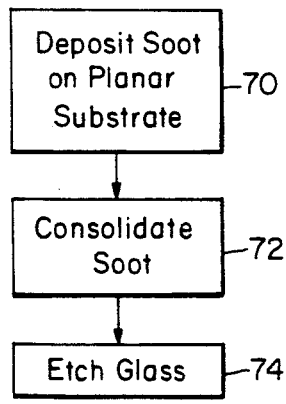
FIG. 3 is a simplified block diagram of a system for fabricating a waveguide according to this invention, consolidating it, and etching it to form discrete optical elements.

Following the fabrication of the rare earth doped planar optical waveguide on the surface of substrate 32 by the depositing of the rare earth doped soot, step 70, FIG. 3, substrate 3 is subject to heat in order to consolidate the unconsolidated soot in step 72. Following this, the consolidated glass layer thus created on surface 34 of substrate 32 is etched in step 74 by any conventional etching method such as ion milling, reactive ion etching, plasma etching, or wet etching. The resulting product can be a simple active element such as a laser or amplifier 80 remaining on the top surface 34b of substrate 32b formed when the remaining portion of the consolidated layer or glass, shown in phantom at 82, has been etched away.

Figure 5:
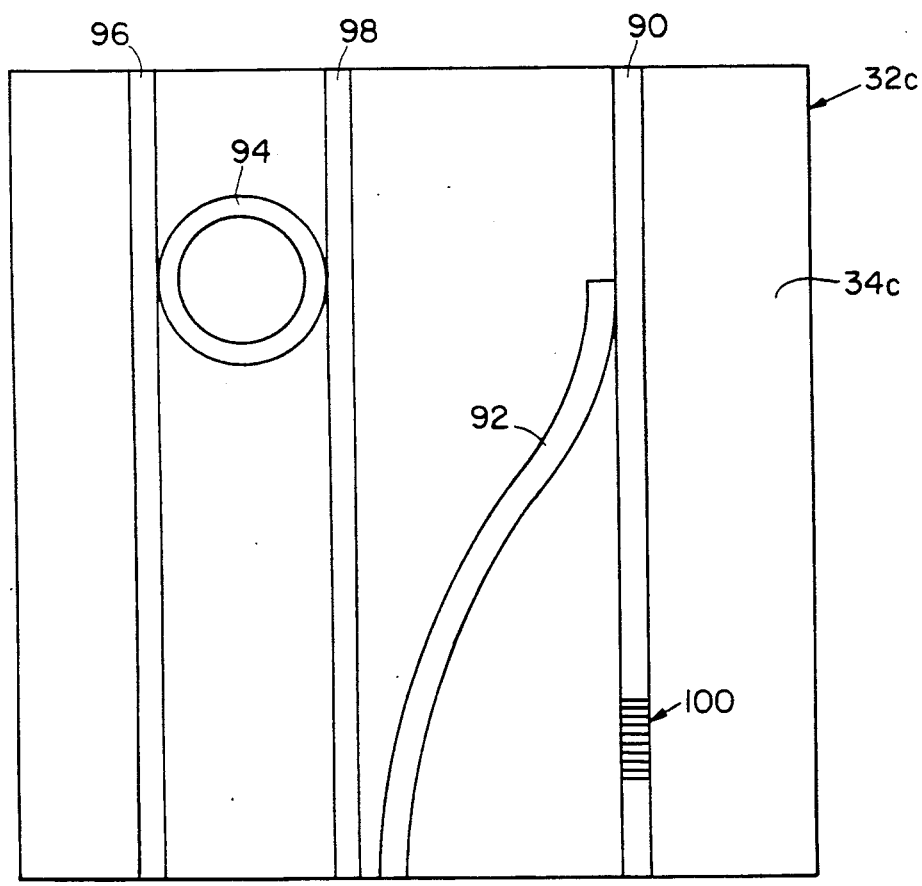
FIG. 5 is a top plan view of a rare earth doped planar optical waveguide according to this invention consolidated and etched to form a number of different active and passive elements on the same substrate.

Alternatively, as shown with respect to substrate 32c, FIG. 5, surface 34c may contain a discrete active element such as a laser constructed in channel waveguide 90 associated with a passive element such as coupler 92. Or, a ring laser 94 may be constructed with passive input 96 and output 98 ports. For wavelength selectability, a Bragg grating 100 could be etched into laser 90 for example. Although in FIG. 5 all of the elements are shown at the same level on surface 34c, which is preferable when the rare earth dopant is neodymium for example, this is not a necessary limitation of the invention. For example, if a three-level system such as erbium is fabricated on surface 34c, the active elements such as lasers 90 and 94 may be on one level and the passive elements 92, 96 and 98 may be on a level above or below it in order to minimize losses in the active layer, so that undoped elements can be integrated with doped elements.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A method of fabricating rare earth doped planar optical waveguides for integrated optical circuits comprising:
   introducing a first carrier gas through a heated column of rare earth chelate to create a flow including rare earth chelate vapor and the first carrier;
   introducing a second carrier gas through a silicon precursor to create a flow including silica precursor vapor and the second carrier;
   introducing a flow of gas including a precursor of a glass homogenizing agent to one of said flow including silicon precursor vapor and said flow including rare earth chelate vapor;
   submitting (1) the flow including the rare earth chelate vapor, (2) the flow including the silica precursor vapor and (3) oxygen gas to a flame hydrolysis deposition burner to produce a soot of rare earth doped silica; depositing said soot on a planar substrate;
   heating said soot deposited on said substrate to consolidate said soot; and
   etching said consolidate soot to define one or more discrete channel waveguides.

2. The method of fabricating rare earth doped planar optical waveguides for integrated optical circuits of claim 1 wherein said first carrier gas is inert.

3. The method of fabricating rare earth doped planar optical waveguides for integrated optical circuits of claim 2 wherein said first carrier gas is helium.

4. The method of fabricating rare earth doped planar optical waveguides for integrated optical circuits of claim 2 wherein said first carrier gas is argon.

5. The method of fabricating rare earth doped planar optical waveguides for integrated optical circuits of claim 1 wherein said rare earth is neodymium.

6. The method of fabricating rare earth doped planar optical waveguides for integrated optical circuits of claim 5 wherein the temperature of said column is approximately 205° C.

7. The method of fabricating rare earth doped planar optical waveguides for integrated optical circuits of claim 1 wherein said rare earth is erbium.

8. The method of fabricating rare earth doped planar optical waveguides for integrated optical circuits of claim 7 wherein the temperature of said column is approximately 175° C.

9. The method of fabricating rare earth doped planar optical waveguides for integrated optical circuits of claim 1 wherein said rare earth is one of the elements selected from the group consisting of: erbium, ytterbium, terbium, thulium, holmium, praseodymium and samarium.

10. The method of a fabricating rare earth doped planar optical waveguides for integrated optical circuits of claim 1 wherein said chelate is one member selected from the group consisting of:
   2,2,6,6-tetramethyl-3,5-heptanedione (thd);
   1,1,1 trifluoro-2,4-pentanedione (tfa)
   1,1,1,5,5,5-hexofluoro-2,4-pentamedione (hfa)
   6,6,7,7,8,8,8-heptafluoro-2,2-dimethyl-3,5-octandione (fod)
   2,2,7-trimethyl-3,5-octanedione (tod)
   1,1,1,5,5,6,6,7,7,7-decafluoro-2,4-heptanedione (dfhd)
   1,1,1-trifluoro-6-methyl-2,4-heptanedione (tfmhd)

11. The method of fabricating rare earth doped planar optical waveguides for integrated optical circuits of claim 1 wherein said second carrier gas includes an inert gas.

12. The method of fabricating rare earth doped planar optical waveguides for integrated optical circuits of claim 11 wherein said inert gas includes helium.

13. The method of fabricating rare earth doped planar optical waveguides for integrated optical circuits of claim 11 wherein said inert gas includes argon.

14. The method of fabricating rare earth doped planar optical waveguides for integrated optical circuits of claim 1 wherein said second carrier gas includes oxygen.

15. The method of fabricating rare earth doped planar optical waveguides for integrated optical circuits of claim 1 wherein said second carrier gas and said silicon precursor are heated.

16. The method of fabricating rare earth doped planar optical waveguides for integrated optical circuits of claim 1 wherein said second carrier gas and said silicon precursor are heated to approximately 35° C.

17. The method of fabricating rare earth doped planar optical waveguides for integrated optical circuits of claim 1 wherein said second carrier gas and said silicon precursor are cooled.

18. The method of fabricating rare earth doped planar optical waveguides for integrated optical circuits of claim 1 wherein said second carrier gas and said silicon precursor are cooled to approximately 20° C.

19. The method of fabricating rare earth doped planar optical waveguides for integrated optical circuits of claim 1 wherein said soot is silicon dioxide.

20. The method of fabricating rare earth doped planar optical waveguides for integrated optical circuits of claim 1 wherein said oxygen gas is delivered directly to said flame hydrolysis deposition burner.

21. The method of fabricating rare earth doped planar optical waveguides for integrated optical circuits of claim 1 wherein said substrate is silica.

22. The method of fabricating rare earth doped planar optical waveguides for integrated optical circuits of claim 1 wherein said substrate is silicon.

23. The method of fabricating rare earth doped planar optical waveguides for integrated optical circuits of claim 1 further comprising introducing a flow of gas including a precursor of a glass homogenizing agent to one of said flow including silicon precursor vapor and said flow including rare earth chelate vapor before submission of said flows to said flame hydrolysis deposition burner to provide a distribution of said glass homogenizing agent on said planar substrate.

24. The method of fabricating rare earth doped planar optical waveguides for integrated optical circuits of claim 23 wherein said precursor of a glass homogenizing agent is aluminum chloride ($AlCl_3$) and said glass homogenizing agent is aluminum oxide ($Al_2O_3$).

25. The method of fabricating rare earth doped planar optical waveguides for integrated optical circuits of claim 23 wherein said precursor of a glass homogenizing agent is phosphorous oxichloride ($POCl_3$) and said glass homogenizing agent is phosphorous oxide ($P_2O_5$).

26. The method of fabricating rare earth doped planar optical waveguides for integrated optical circuits of claim 23 wherein the step of introducing a precursor of a glass homogenizing agent includes passing a carrier gas through an aluminum precursor.

27. The method of fabricating rare earth doped planar optical waveguides for integrated optical circuits of claim 23 wherein the step of introducing a precursor of a glass homogenizing agent includes passing a carrier gas through a phosphorous precursor.

28. A method of fabricating rare earth doped planar optical waveguides for integrated optical circuits comprising:

introducing a first carrier gas through a heated column of rare earth chelate to create a flow including rare earth chelate vapor and the first carrier wherein the rare earth is from the group of cerium, praseodymium, neodymium, samarium, europium, gadolinium, terbium, dysprosium, holmium, erbium, thulium and ytterbium, and the chelate is one member selected from the group consisting of:

2,2,6,6-tetramethyl-3,5-heptanedione (thd);

1,1,1 trifluoro-2,4-pentanedione (tfa)

1,1,1,5,5,5-hexofluoro-2,4-pentamedione (hfa)

6,6,7,7,8,8,8-heptafluoro-2,2-dimethyl-3,5-octandione (fod)

2,2,7-trimethyl-3,5-ortanedione (tod)

1,1,1,5,5,6,6,7,7,7-decafluoro-2,4-heptanedione (dfhd)

1,1,1-trifluoro-6-methyl-2,4-heptanedione (tfmhd);

introducing a second carrier gas through a silicon precursor to create a flow including silicon precursor vapor and the second carrier;

submitting the flow including rare earth chelate vapor, the flow including silicon precursor vapor and oxygen gas to a flame hydrolysis deposition burner to produce a soot of rare earth doped silica; and depositing said soot on a planar substrate.

* * * * *